(12) United States Patent
Myong et al.

(10) Patent No.: US 6,356,424 B1
(45) Date of Patent: *Mar. 12, 2002

(54) ELECTRICAL PROTECTION SYSTEMS

(75) Inventors: Inho Myong, Newark, CA (US);
William T. Presley, Macomb Township, MI (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/274,561

(22) Filed: Mar. 23, 1999

Related U.S. Application Data

(63) Continuation of application No. 09/019,767, filed on Feb. 6, 1998, now abandoned.

(51) Int. Cl.$^7$ ................................................ H02H 3/00
(52) U.S. Cl. .................... 361/93.7; 361/93.1; 361/93.9; 361/106; 361/165; 361/86
(58) Field of Search ............................... 361/93.1, 93.7, 361/93.4, 93.8, 93.9, 106, 165, 86, 56–58, 99, 161, 187; 307/132 T, 132 V, 132 R, 130–131; 338/22 R

(56) References Cited

U.S. PATENT DOCUMENTS

| | | | |
|---|---|---|---|
| 4,237,441 A | 12/1980 | Van Konynenburg et al. | 338/22 |
| 4,238,812 A | 12/1980 | Middleman et al. | 361/106 |
| 4,315,237 A | 2/1982 | Middleman et al. | 338/22 |
| 4,317,027 A | 2/1982 | Middleman et al. | 219/553 |
| 4,320,309 A | 3/1982 | Griffiths et al. | 307/132 |
| 4,426,633 A | 1/1984 | Taylor | 338/25 |
| 4,545,926 A | 10/1985 | Fouts et al. | 252/511 |
| 4,631,474 A | 12/1986 | Dolland et al. | 324/73 |
| 4,689,475 A | 8/1987 | Matthiesen | 219/553 |

(List continued on next page.)

FOREIGN PATENT DOCUMENTS

| | | | |
|---|---|---|---|
| WO | WO 98/02946 | 1/1998 | H02H/3/08 |

OTHER PUBLICATIONS

Patent Abstracts of Japan, vol. 095, No. 010, Nov. 30, 1995 and Japanese Publication No. 07–170727 (URD), Jul. 4, 1995 (abstract only).
U.S. Application No. 08/584,861 (Duffy et al, filed Jan. 5, 1996).
U.S. Application No. 08/658,782 (Duffy et al, filed Jun. 5, 1996).
U.S. Application No. 08/682,067 (Myong et al, filed Jul. 16, 1996).
U.S. Application No. 08/682,172 (Myong, filed Jul. 16, 1996).
U.S. Application No. 08/868,905 (Myong, filed Jun. 4, 1997).
Search Report dated May 26, 1999, for International Application No. PCT/US99/02262.

Primary Examiner—Michael J. Sherry

(57) ABSTRACT

An electrical protection system on a power distribution side includes a control element of a series combination of a PTC device thermally coupled with a resistive device, and a relay coil coupled with relay contacts. If the relay contacts are open the only way in which they can be closed is by supplying current to the relay coil through a resistance-capacitance network. An electronic control module on a control side includes an electronic control module for monitoring a voltage present in the system, and a switch for opening a current path feeding the system upon detection of a fault condition. An indicator indicates presence of a sensed fault condition.

10 Claims, 2 Drawing Sheets

U.S. PATENT DOCUMENTS

| | | | |
|---|---|---|---|
| 4,724,417 A | 2/1988 | Au et al. | 338/22 |
| 4,774,024 A | 9/1988 | Deep et al. | 252/511 |
| 4,780,598 A | 10/1988 | Fahey et al. | 219/511 |
| 4,800,253 A | 1/1989 | Kleiner et al. | 219/553 |
| 4,845,838 A | 7/1989 | Jacobs et al. | 29/671 |
| 4,857,880 A | 8/1989 | Au et al. | 338/22 |
| 4,859,836 A | 8/1989 | Lunk et al. | 219/548 |
| 4,907,340 A | 3/1990 | Fang et al. | 29/610.1 |
| 4,924,074 A | 5/1990 | Fang et al. | 219/548 |
| 4,935,156 A | 6/1990 | van Konynenburg et al. | 219/553 |
| 4,967,176 A | 10/1990 | Horsma et al. | 338/22 |
| 5,049,850 A | 9/1991 | Evans et al. | 338/22 |
| 5,089,801 A | 2/1992 | Chan et al. | 338/22 |
| 5,296,996 A | 3/1994 | Hansson et al. | 361/24 |
| 5,378,407 A | 1/1995 | Chandler et al. | 252/513 |
| 5,451,919 A | 9/1995 | Chu et al. | 338/22 |
| 5,451,921 A | 9/1995 | Crawford et al. | 338/220 |
| 5,590,010 A | 12/1996 | Ceola et al. | 361/93 |
| 5,645,746 A | 7/1997 | Walsh | 219/505 |
| 5,666,254 A | 9/1997 | Thomas et al. | 361/8 |
| 5,689,395 A | 11/1997 | Duffy et al. | 361/93 |
| 5,745,322 A | 4/1998 | Duffy et al. | 361/45 |
| 5,852,397 A | 12/1998 | Chan et al. | 338/22 |
| 5,864,458 A | 1/1999 | Duffy et al. | 361/93 |
| 6,072,679 A * | 6/2000 | Myong | 361/93.7 |

* cited by examiner

ELECTRICAL PROTECTION SYSTEMS

CROSS-REFERENCE TO RELATED APPLICATIONS

This is a continuation of patent application Ser. No. 09/019,767, filed on Feb. 6, 1998, and now abandoned. The present application is related to U.S. patent application Ser. No. 09/019,766, filed on Feb. 6, 1998, now abandoned in favor of a copending continuation application Ser. No. 09/273,635 filed on Mar. 23, 1999, now U.S. Pat. No. 6,072,679. These applications describe a number of improved protection systems based on those disclosed in Applications Ser. Nos. 08/869,905, 08/682,067 and 08/682,172 now all abandoned. The present invention provides further improvements in the systems disclosed in Ser. Nos. 08/868,905, 08/682,172 and in Ser. Nos. 09/019,766, now all abandoned and 09/273,635, now U.S. Pat. No. 6,072,679 having the same effective filing date as the parent of this application.

BACKGROUND OF THE INVENTION

1. Field of the Invention

This invention relates to electrical systems which contain positive temperature coefficient (PTC) circuit protection devices, particularly such systems in automobiles and other wheeled vehicles.

2. Introduction to the Invention

PTC devices are well known. Particularly useful devices contain PTC elements composed of a PTC conductive polymer, i.e. a composition comprising an organic polymer and, dispersed or otherwise distributed therein, a particulate conductive filler, e.g. carbon black, a metal or a conductive metal compound. Such devices are referred to herein as polymer PTC, or PPTC, devices. Other PTC materials are also known, e.g. doped ceramics, but are not as generally useful as PTC conductive polymer, in particular because they have higher resistivities. PTC devices can be used in a number of different ways, and are particularly useful in circuit protection applications, in which they function as remotely resettable fuses to protect electrical components from excessive currents and/or temperatures. Components which can be protected in this way include motors, batteries, loudspeakers and wiring harnesses in automobiles. The use of PPTC devices in this way has grown rapidly over recent years, and continues to increase. Reference may be made for example to U.S. Pat. Nos. 4,237,441, 4,238,812, 4,315,237, 4,317,027, 4,426,633, 4,545,926, 4,689,475, 4,724,417, 4,774,024, 4,780,598, 4,800,253, 4,845,838, 4,857,880, 4,859,836, 4,907,340, 4,924,074, 4,935,156, 4,967,176, 5,049,850, 5,089,801, 5,378,407, 5,451,919, 5,451,921, and 5,645,746, and to copending commonly assigned U.S. application Ser. No. 08/900,787 now U.S. Pat. No. 5,852,397, the disclosures of which are incorporated herein by reference for all purposes.

More recently, it has been proposed to combine PTC devices with other electrical components to provide circuit protection systems which respond to faults in ways which make use of the characteristics of both the PTC device and the electrical component. Reference may be made for example to U.S. Pat. Nos. 5,666,254 and 5,689,395, and to copending commonly assigned U.S. application Ser. Nos. 08/564,465 (Duffy et al., filed Nov. 29, 1995) now U.S. Pat. No. 5,864,458, 08/563,321 (Duffy et al., filed Nov. 28, 1995) now U.S. Pat. No. 5,745,322, 08/584,861 (Duffy et al., filed Jan. 5, 1996) abandoned in favor of continuation application Ser. No. 09/145,799, filed on Sep. 2, 1998,which has been abandoned in favor of continuation application Ser. No. 09/311,785 filed on May 14, 1999and now abandoned 08/658,782 (Duffy et al., filed Jun. 5, 1996) now abandoned 08/682,067 (Myong et al., filed Jul. 16, 1996) abandoned in favor of continuation application Ser. No. 09/156,933, filed Sep. 18, 1998 and 08/682,172 (Myong, filed Jul. 16, 1996) now abandoned and 08/868,905 (Myong, filed Jun. 4, 1997) abandoned in favor of continuation application Ser. No. 09/248,166 filed on Feb. 9, 1999 the disclosures of which are incorporated herein by reference for all purposes.

Ser. Nos. 08/682,067 and 08/682,172 describe protection systems which comprise a sensor element (typically a resistor) and a circuit interruption element (typically a relay) in series with the load, and a control element (typically a PTC device in parallel with the sensor element) which links the sensor element and the circuit interruption element so that an overcurrent is detected by the sensor element, and causes a change in the control element, which in turn causes a change in (typically opens) the circuit interruption element. Depending on the arrangement of these and other components, the system can (a) latch in an open state, either with or without a trickle current to keep the PTC device in a tripped condition, or (b) reclose if the overcurrent has gone away or cycle between open and closed positions if the overcurrent remains. Ser. No. 08/868,905 describes particularly useful devices for use in the protection systems of Ser. Nos. 08/682,067 and 08/682,172.

In the design of electrical systems for automobiles and like complex systems, it is usual for an electronic control module (ECM) to be connected to the electrical system through a connector bar having a number of separate contacts. The normal application of modular construction principles means that the number of contacts cannot easily be changed, and competition for space dictates that the number of contacts be kept to a minimum. It is, therefore, highly desirable for each electrical system connected to a connector bar to make use of a minimum number of contacts, preferably a single contact. For example, U.S. Pat. No. 5,645,746 refers to the possibility of monitoring the state of a PTC device by means of an LED or other voltage sensor; this works well, but requires the use of two positions on the connector bar.

SUMMARY OF THE INVENTION

In many electrical systems, it is desirable to incorporate diagnostics which will signal the condition of the system, at least when there has been a malfunction. Particularly is this so in automobiles and like complex systems in which the occurrence of a malfunction may not be immediately apparent. We have found that the protection systems described in Ser. Nos. 08/682,067 and 08/682,172 can be modified and combined with other components to provide both fault protection and diagnostic capabilities which do not depend upon manual interaction. For brevity and convenience, protection systems of the kind disclosed in Ser. Nos. 08/682,067 and 08/682,172 are referred to herein as TLPRR systems (TLPRR being an acronym for Thermally Linked PTC device, Resistor and Relay).

The first step in making use of TLPRR systems in diagnostics is to modify the TLPRR system disclosed in the earlier applications by replacing the momentary-on switch disclosed in those applications by a remotely-operated system which will activate the relay coil and thus close the relay contacts. Such a modified TLPRR system is referred to herein as a TLPRR (Mod) system. This modification can result in significant improvements even when not combined with diagnostic capabilities, and as such it forms an independent part of the present invention. Preferably the remotely-operated system comprises a resistor-capacitor (RC) network or other electrical system which occupies only a single position on a connector bar at a power distribution side. However, it is also possible to use a two-line system which activates the relay coil simply by passing a current through it for a sufficient time. Another important advantage of an RC circuit is that it can be designed to produce other useful functionality. The capacitor can be charged up by closing a switching unit at the return side of the coil (also known as low-side switching), and must have a size such that its discharge provides current to the relay coil long enough to close the relay contacts. Thereafter, the capacitor is charged up to the system voltage and acts as an open switch under normal operating conditions. If an overcurrent occurs, tripping the PTC device and opening the relay contacts, the sizes of the capacitor and the resistor will be significant factors in determining the time which will elapse before the TLPRR (Mod) attempts to reset. Thus the capacitor and resistor can be selected so as to result in a desired delay. Another important advantage of the RC network is that it protects the relay contacts if, when the system is turned on, there is a high current short circuit which sufficiently drops the system voltage to a level below the required relay activation voltage. In this case, the RC network will not have enough voltage to charge up the capacitor sufficiently to close the relay.

An embodiment of the present invention comprises an electrical protection system which can be connected between an electrical power supply and an electrical load to form an operating circuit, the operating circuit having an on state and an off state and comprising a current carrying line and a return line, and which when so connected protects the circuit from overcurrents, the system having a normal operating condition and a fault condition, and comprising:

a. a set of relay contacts which, when the system is so connected, is connected in series between the power supply and the load, and has:
  i. a closed state which permits the flow of a normal current, $I_{NORMAL}$, when the system is in the normal operating condition, and
  ii. an open state which permits the flow of at most a reduced current, substantially less than $I_{NORMAL}$, when the system is in the fault condition;

b. a resistive device which, when the system is so connected, is connected in series with the set of relay contacts and the load, and has
  i. a normal state, when the current in the system does not exceed the normal current, $I_{NORMAL}$, by a predetermined current amount, and
  ii. a fault state, when the current in the system exceeds the normal current, $I_{NORMAL}$, by the predetermined amount;

c. a control element which comprises a series combination of
  i. a PTC device thermally coupled with the resistive device; and
  ii. a relay coil coupled with the relay contacts;
  the series combination being connected across the power supply, between the current carrying line and the return line, with the PTC device connected to the current carrying line and the relay coil coupled to the return line;

the set of relay contacts changing from its closed state to its open state, thereby causing the system to change from its normal operating condition to its fault condition, when the resistance of the PTC device increases by a predetermined resistance amount in response to the resistive element changing from its normal state to its fault state; and d. a relay coil current supply means which enables current to be supplied to the relay coil, so that if the relay contacts are open, the only way in which they can be closed is by supplying current to the relay coil through the relay coil current supply means.

DETAILED DESCRIPTION OF PREFERRED EMBODIMENTS

Figure 1:
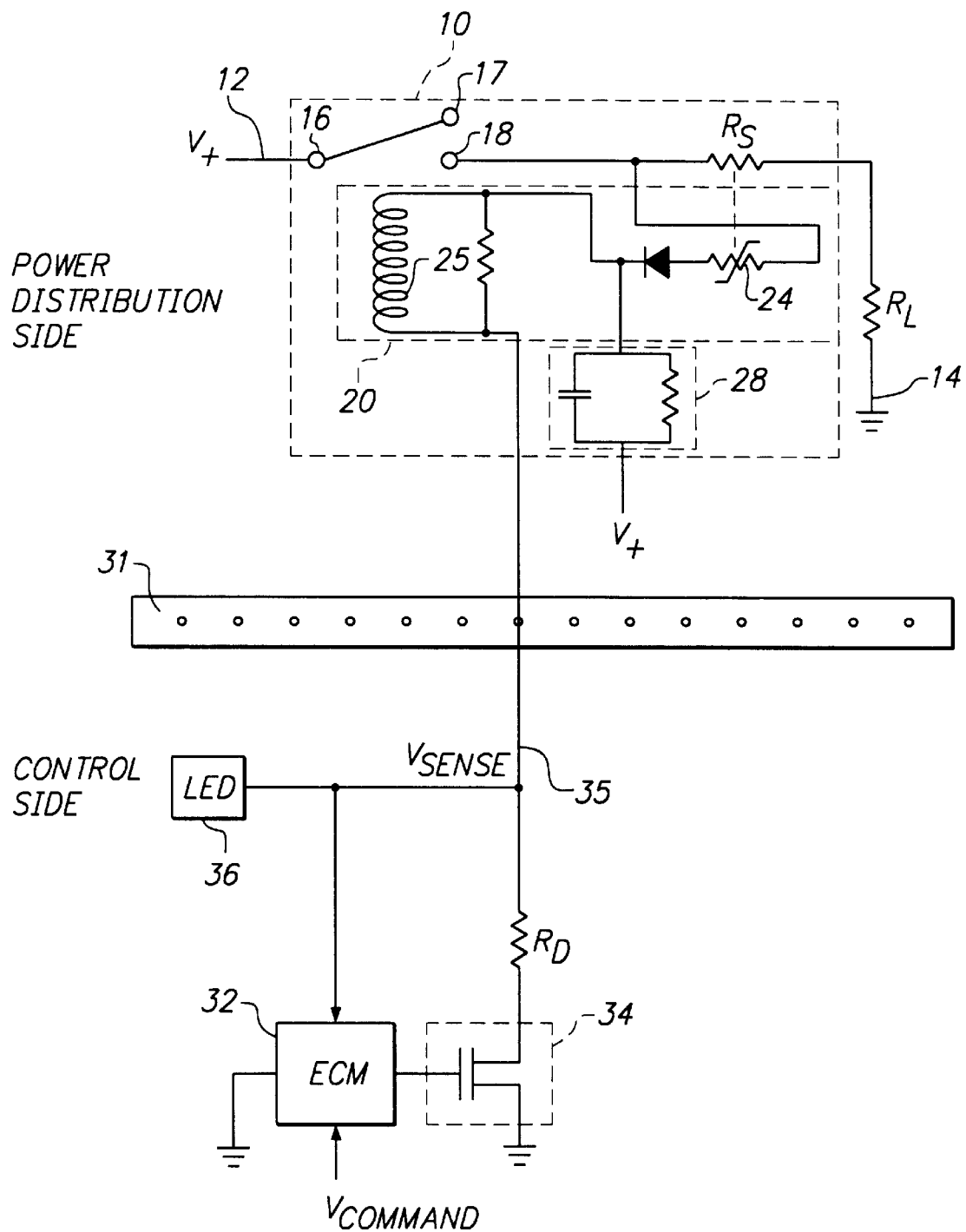
FIG. 1 shows a first embodiment according to the present invention.

As illustrated in FIG. 1, this invention provides, at a power distribution side, an electrical protection system 10 which is connected between an electrical power supply V+ and an electrical load $R_L$ to form an operating circuit, the operating circuit having an on state and an off state and comprising a current carrying line 12 and a return line 14, and which when so connected protects the circuit from overcurrents, the system having a normal operating condition and a fault condition, and comprising:

a a set of relay contacts 16, 17 and 18 which, when the system is so connected, is connected in series between the power supply V+ and the load $R_L$, and has:
  i. a closed state which permits the flow of a normal current, $I_{NORMAL}$, when the system is in the normal operating condition, and
  ii. an open state which permits the flow of at most a reduced current, substantially less than $I_{NORMAL}$, when the system is in the fault condition;

b. a resistive device Rs which, when the system is so connected, is connected in series with the set of relay contacts 16, 17 and 18 and the load $R_L$, and has
  i. a normal state, when the current in the system does not exceed the normal current, $I_{NORMAL}$, by a predetermined current amount, and
  ii. a fault state, when the current in the system exceeds the normal current, $I_{NORMAL}$, by the predetermined amount;

c. a control element 20 which comprises a series combination of
  i. a PTC device 24 thermally coupled with the resistive device $R_s$; and
  ii. a relay coil 25 coupled with the relay contacts;
  the series combination being connected across the power supply, between the current carrying line and the return line, with the PTC device connected to the current carrying line and the relay coil coupled to the return line;

the set of relay contacts changing from its closed state to its open state, thereby causing the system to change from its normal operating condition to its fault condition, when the resistance of the PTC device increases by a predetermined resistance amount in response to the resistive element changing from its normal state to its fault state; and d. a relay coil current supply means, such as RC network 28, which enables current to be supplied to the relay coil, so that if the relay contacts are open, the only way in which they can be closed is by supplying current to the relay coil through the relay coil current supply means.

An electrical protection system comprising a TLPRR (Mod) system is disclosed in U.S. Pat. No. 6,072,679 to co-inventor Myong, for example.

A TLPRR (Mod) system can advantageously be used as part of a diagnostic system, especially in an electrical system containing a connector bar 31 through which one or more of a number of electrical systems (one or more of which can be TLPRR (Mod) systems) can be separately connected to an electronic control module (ECM) 32 at the control side. The ECM, upon command $V_{Command}$, can close or open a switch 34. The switch 34 controls a line (called herein the "diagnostic line") which is connected to the return side of the relay coil through a series resistor $R_D$ (called herein the "diagnostic resistor"). The switch is preferably an FET, particularly an FET with certain level of diagnostics capabilities, e.g. over-voltage, over-temperature, over-current conditions, but any other type of solid state switch, or even a mechanical relay, can be used. By examining the voltage $V_{SENSE}$ on the diagnostic line, and knowing the system voltage delivered by the FET (or other switch), it is possible to diagnose the condition of the main load circuit. $V_{SENSE}$ can be sensed by the ECM 32 and indicated by an LED 36. Thus the voltage $V_{SENSE}$ on the diagnostic line will be one of three values, namely (I) the full system voltage (e.g. nominally 12 volts in a conventional automobile), if the main load circuit is in a normal off state; (2) an intermediate voltage (set by the relative resistances of the diagnostic resistor and of the relay coil) if the main load circuit is in a normal operating state and (3) substantially zero if (i) the relay coil has failed, (ii) there has been a fault which has caused the PTC to trip and the relay contacts to open, or (iii) there is a high current short circuit. This information can, if desired, be stored in the ECM and used for system inquiry either during assembly of an electrical system, for maintenance of a system which is in use, or to disable a faulty system by turning off the FET until the fault condition is corrected, or to indicate to a user the system fault condition by using the LED 36, for example.

Thus as illustrated in FIG. 1, this invention provides an electrical system which comprises (1) an electronic control module (ECM), (2) a switch controlled by the ECM, (3) a TLPRR (Mod) system as defined above, (4) a diagnostics resistor which is connected in series between the switch and the protection system, and (5) means for determining the voltage on a line between the diagnostics resistor and the protection system, the relay coil and the relay contacts being operable by a voltage which is the system voltage minus the voltage dropped across the diagnostics resistor.

The resistance of the diagnostic resistor can be for example 0.7 to 1.3 times the resistance of the relay coil.

If the relay coil is designed to close the relay contacts only when the fill system voltage is dropped across the coil (as will usually be the case), then the insertion of the diagnostic resistor $R_D$ will make it impossible to close the relay contacts. This difficulty can be overcome in two different ways. The first way is to use a relay coil/contact arrangement which will be operated by the residue of the system voltage which is not dropped across the sense resistor $R_s$. The second way is, as illustrated in FIG. 2, to put a capacitor $C_D$ in parallel with the diagnostic resistor $R_D$, thus creating an RC network which will enable the relay to be closed upon command.

Figure 2:
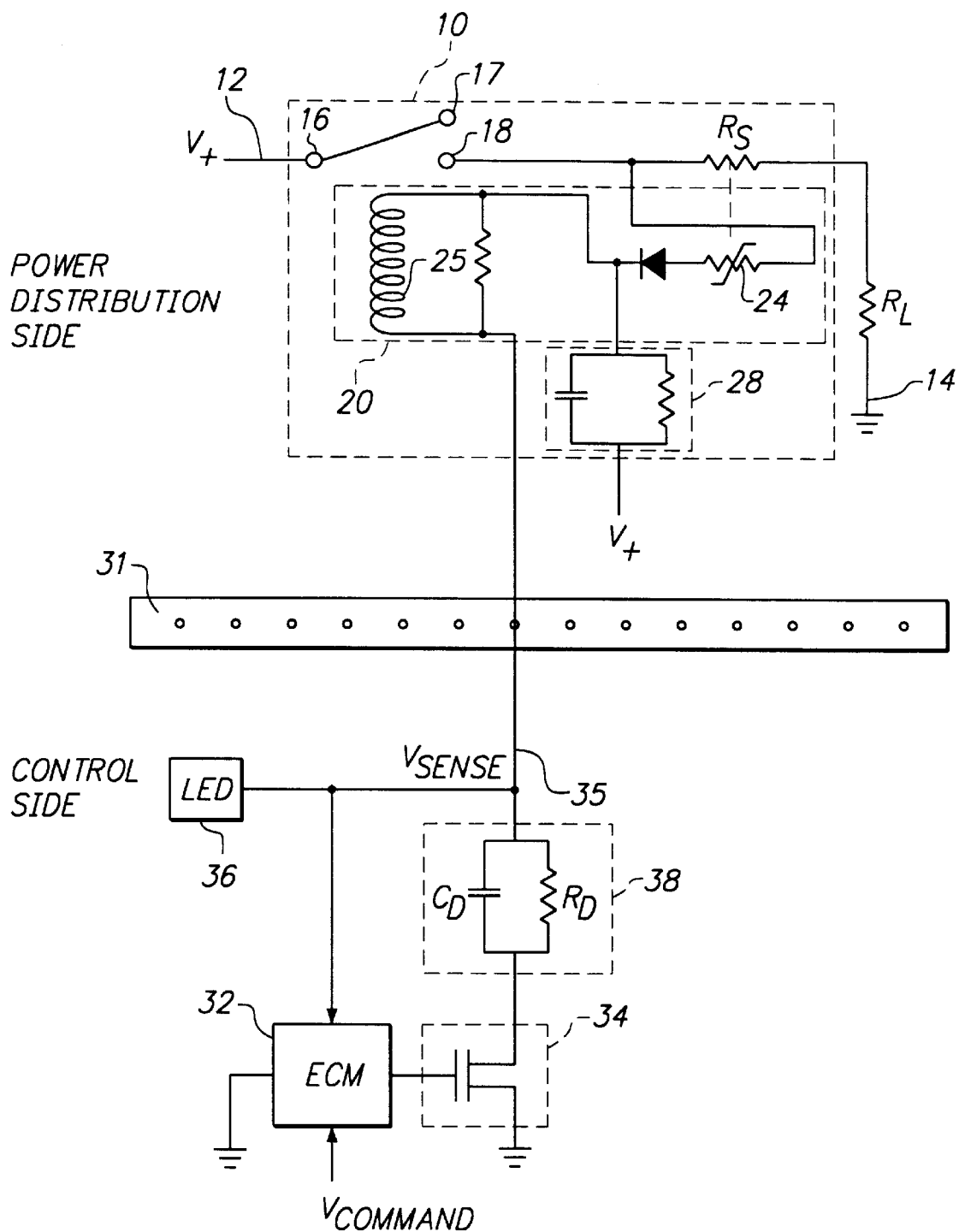
FIG. 2 shows a second embodiment according to the present invention.

As illustrated in FIG. 2, a second embodiment of this invention provides an electrical system which comprises (1) an electronic control module (ECM) 32, (2) a switch 34 controlled by the ECM, (3) a TLPRR (Mod) system as defined above at the power distribution side, (4) an RC network 38 which is connected in series between the switch and the protection system, and (5) means for determining the voltage $V_{SENSE}$ on a line 35 between the RC network and the protection system.

The circuitry at the control side can also be used in conjunction with other circuit configurations at the power distribution side such as illustrated in FIGS. 2, 3, 5–8 and 10 in Ser. No. 08/682,067.

While the above is a description of the specific embodiments, various modifications, alternative constructions, and equivalents may be used. Therefore, the above description and illustrations should not be taken as limiting the scope of the present invention which is defined by the appended claims.

What is claimed is:

1. An electrical protection system which can be connected between an electrical power supply and an electrical load to form an operating circuit, the operating circuit having an on state and an off state and comprising a current carrying line and a return line, and which when so connected protects the circuit from overcurrents, the system having a normal operating condition and a fault condition, and comprising:

a. a set of relay contacts which, when the system is so connected, is connected in series between the power supply and the load, and has:

i. a closed state which permits the flow of a normal current, $I_{NORMAL}$, when the system is in the normal operating condition, and ii. an open state which permits the flow of at most a reduced current, substantially less than $I_{NORMAL}$, when the system is in the fault condition;

b. a resistive device which, when the system is so connected, is connected in series with the set of relay contacts and the load, and has i. a normal state, when the current in the system does not exceed the normal current, $I_{NORMAL}$, by a predetermined current amount, and ii. a fault state, when the current in the system exceeds the normal current, $I_{NORMAL}$, by the predetermined amount;

c. a control element which comprises a series combination of i. a PTC device thermally coupled with the resistive device; and ii. a relay coil coupled with the relay contacts;

the series combination being connected across the power supply, between the current carrying line and the return line, with the PTC device connected to the current carrying line and the relay coil coupled to the return line;

the set of relay contacts changing from its closed state to its open state, thereby causing the system to change from its normal operating condition to its fault condition, when the resistance of the PTC device increases by a predetermined resistance amount in response to the resistive device changing from its normal state to its fault state; and d. a relay coil current supply means which enables current to be supplied to the relay coil, so that if the relay contacts are open, the only way in which they can be closed is by supplying current to the relay coil through the relay coil current supply means.

2. A system according to claim 1 wherein the relay coil current supply means comprises a resistance capacitance (RC) network which is connected to the relay coil and which, when the relay contacts are open, can be charged up and will then supply sufficient current through the relay coil to close the relay contacts.

3. A system according to claim 2 wherein the RC network protects against high current short circuit at the turn-on of the system.

4. An electrical protection system which can be connected between an electrical power supply and an electrical load to form an operating circuit, the operating circuit having an on state and an off state and comprising a current carrying line and a return line, and which when so connected protects the circuit from overcurrents, the system having a normal operating condition and a fault condition, and comprising:
   a. a set of relay contacts which, when the system is so connected, is connected in series between the power supply and the load, and has:
      i. a closed state which permits the flow of a normal current, $I_{NORMAL}$, when the system is in the normal operating condition, and
      ii. an open state which permits the flow of at most a reduced current, substantially less than $I_{NORMAL}$, when the system is in the fault condition;
   b. a resistive device which, when the system is so connected, is connected in series with the set of relay contacts and the load, and has
      i. a normal state, when the current in the system does not exceed the normal current, $I_{NORMAL}$, by a predetermined current amount, and
      ii. a fault state, when the current in the system exceeds the normal current, $I_{NORMAL}$, by the predetermined amount;
   c. a control element which comprises a series combination of
      i. a PTC device thermally coupled with the resistive device; and
      ii. a relay coil coupled with the relay contacts;
      the series combination being connected across the power supply, between the current carrying line and the return line, with the PTC device connected to the current carrying line and the relay coil coupled to the return line;
   the set of relay contacts changing from its closed state to its open state, thereby causing the system to change from its normal operating condition to its fault condition, when the resistance of the PTC device increases by a predetermined resistance amount in response to the resistive device changing from its normal state to its fault state; and
   d. a relay coil current supply means which enables current to be supplied to the relay coil, so that if the relay contacts are open, the only way in which they can be closed is by supplying current to the relay coil through the relay coil current supply means, and wherein the relay coil current supply means comprises a resistance capacitance (RC) network which is connected to the relay coil and which, when the relay contacts are open, can be charged up and will then supply sufficient current through the relay coil to close the relay contacts; and
   e. an electronic control module (ECM), including means for sensing voltage on a current return line connected to the relay coil,
   f. a switch controlled by the ECM and connected to open a current return path including the current return line, and
   g. an RC network connected in series between the switch and the current return line.

5. A system according to claim 4 wherein the ECM disables the system by opening the switch upon detecting a fault condition of the system based on the voltage sensed.

6. A system according to claim 4, further comprising an indicator for indicating a fault condition of the system based upon the voltage sensed.

7. A system according to claim 4 wherein the switch is an FET.

8. An electrical protection system which can be connected between an electrical power supply and an electrical load to form an operating circuit, the operating circuit having an on state and an off state and comprising a current carrying line and a return line, and which when so connected protects the circuit from overcurrents, the system having a normal operating condition and a fault condition, and comprising:
   a. a set of relay contacts which, when the system is so connected, is connected in series between the power supply and the load, and has:
      i. a closed state which permits the flow of a normal current, $I_{NORMAL}$, when the system is in the normal operating condition, and
      ii. an open state which permits the flow of at most a reduced current, substantially less than $I_{NORMAL}$, when the system is in the fault condition;
   b. a resistive device which, when the system is so connected, is connected in series with the set of relay contacts and the load, and has
      i. a normal state, when the current in the system does not exceed the normal current, $I_{NORMAL}$, by a predetermined current amount, and
      ii. a fault state, when the current in the system exceeds the normal current, $I_{NORMAL}$, by the predetermined amount;
   c. a control element which comprises a series combination of
      i. a PTC device thermally coupled with the resistive device; and
      ii. a relay coil coupled with the relay contacts;
      the series combination being connected across the power supply, between the current carrying line and the return line, with the PTC device connected to the current carrying line and the relay coil coupled to the return line;
   the set of relay contacts changing from its closed state to its open state, thereby causing the system to change from its normal operating condition to its fault condition, when the resistance of the PTC device increases by a predetermined resistance amount in response to the resistive device changing from its normal state to its fault state; and
   d. a relay coil current supply means which enables current to be supplied to the relay coil, so that if the relay contacts are open, the only way in which they can be closed is by supplying current to the relay coil through the relay coil current supply means, and wherein the relay coil current supply means comprises a resistance capacitance (RC) network which is connected to the relay coil and which, when the relay contacts are open, can be charged up and will then supply sufficient current through the relay coil to close the relay contacts; and
   e. an electronic control module (ECM), including means for sensing voltage on a current return line connected to the relay coil,
   f. a switch controlled by the ECM and connected to open a current return path including the current return line, and g. a diagnostics resistor connected in series between the switch and the current return line.

9. A system according to claim 8 wherein the ECM disables the system by opening the switch upon detecting a fault condition of the system based on the voltage sensed.

10. A system according to claim 8, further comprising an indicator for indicating a fault condition of the system based upon the voltage sensed.

* * * * *